United States Patent
Xie et al.

(10) Patent No.: US 11,152,265 B2
(45) Date of Patent: Oct. 19, 2021

(54) LOCAL ISOLATION OF SOURCE/DRAIN FOR REDUCING PARASITIC CAPACITANCE IN VERTICAL FIELD EFFECT TRANSISTORS

(71) Applicant: International Business Machines Corporation, Armonk, NY (US)

(72) Inventors: Ruilong Xie, Niskayuna, NY (US); Hemanth Jagannathan, Niskayuna, NY (US); Christopher J. Waskiewicz, Rexford, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/528,748

(22) Filed: Aug. 1, 2019

(65) Prior Publication Data

US 2021/0035867 A1    Feb. 4, 2021

(51) Int. Cl.
| | |
|---|---|
| H01L 21/8234 | (2006.01) |
| H01L 27/088 | (2006.01) |
| H01L 29/66 | (2006.01) |
| H01L 21/762 | (2006.01) |
| H01L 29/78 | (2006.01) |

(52) U.S. Cl.
CPC ........... *H01L 21/823481* (2013.01); *H01L 21/76224* (2013.01); *H01L 21/823487* (2013.01); *H01L 27/088* (2013.01); *H01L 29/6653* (2013.01); *H01L 29/6656* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 6,541,320 B2 | 4/2003 | Brown et al. | |
| 6,864,560 B2 | 3/2005 | Khater et al. | |
| 9,472,447 B1 | 10/2016 | Kanakasabapathy et al. | |
| 9,716,170 B1 | 7/2017 | Cheng et al. | |
| 9,748,380 B1 | 8/2017 | Lie et al. | |
| 9,780,194 B1 | 10/2017 | Balakrishnan et al. | |
| 9,853,028 B1 * | 12/2017 | Cheng | H01L 29/517 |
| 10,014,370 B1 | 7/2018 | Xie et al. | |

(Continued)

*Primary Examiner* — Zandra V Smith
*Assistant Examiner* — Lawrence C Tynes, Jr.
(74) *Attorney, Agent, or Firm* — Fleit Intellectual Property Law; Thoma S. Grzesik

(57) ABSTRACT

A vertical field effect transistor structure and method for fabricating the same. The structure includes a source/drain layer in contact with at least one semiconductor fin. An edge portion of the source/drain layer includes a notched region filled with a dielectric material. A spacer layer includes a first portion in contact with the source/drain layer and a second portion in contact with the dielectric material. A gate structure contacts the spacer layer and the dielectric material. The method includes forming a source/drain layer in contact with at least one semiconductor fin. A spacer layer is formed in contact with the source/drain layer. A portion of the spacer layer is removed to expose an end portion of the source/drain layer. The exposed end portion of the source/drain layer is recessed to form a notched region within the source/drain layer. A dielectric layer is formed within the notched region.

20 Claims, 13 Drawing Sheets

(56) References Cited

U.S. PATENT DOCUMENTS

| | | |
|---|---|---|
| 10,090,412 B1 | 10/2018 | Cheng et al. |
| 10,157,798 B1 * | 12/2018 | Chi ................. H01L 21/823487 |
| 10,211,315 B2 | 2/2019 | Zang et al. |
| 2009/0302402 A1 * | 12/2009 | Anderson ......... H01L 29/66803 |
| | | 257/411 |

* cited by examiner

LOCAL ISOLATION OF SOURCE/DRAIN FOR REDUCING PARASITIC CAPACITANCE IN VERTICAL FIELD EFFECT TRANSISTORS

BACKGROUND OF THE INVENTION

The present invention generally relates to the field of semiconductors, and more particularly relates to vertical field effect transistors.

Vertical field effect transistors (VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method for forming a vertical field effect transistor structure is disclosed. The method comprises forming a source/drain layer in contact with at least one semiconductor fin. A spacer layer is formed in contact with the source/drain layer. A portion of the spacer layer is removed to expose an end portion of the source/drain layer underlying a region where a gate structure is to be subsequently formed. The exposed end portion of the source/drain layer is recessed. The recessing forms a notched region within the source/drain layer. A dielectric layer is formed within the notched region.

In another embodiment, a method for forming a semiconductor structure comprising a plurality of vertical field effect transistors is disclosed. The method comprises forming a plurality of source/drain layers each in contact with at least one semiconductor fin of a plurality of semiconductor fins and each isolated from one another by an isolation trench. Each isolation trench comprises an isolation material. The isolation material in each isolation trench is recessed below a top surface of the plurality of source/drain layers. The recessing exposes sidewalls of the plurality of source/drain layers. A spacer layer is formed in contact with at least a top surface and the sidewalls of each source/drain layer of the plurality of source/drain layers. One or more portions of the spacer layer are removed to expose an end portion of each source/drain layer of the plurality of source/drain layers underlying a region where a gate structure is to be subsequently formed. The exposed one or more end portions are recessed. The recessing forms a notched region within each source/drain layer of the plurality of source/drain layers. A dielectric layer is formed within each notched region.

In a further embodiment, a vertical field effect transistor structure is disclosed. The vertical field effect transistor structure comprises a source/drain layer in contact with at least one semiconductor fin. An edge portion of the source/drain layer comprises a notched region comprising a dielectric material. A first portion of a spacer layer is in contact with at least a top surface of the source/drain layer, and a second portion of the spacer layer is in contact with the dielectric material. A gate structure is in contact with at least the first portion of the spacer layer and the dielectric material.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
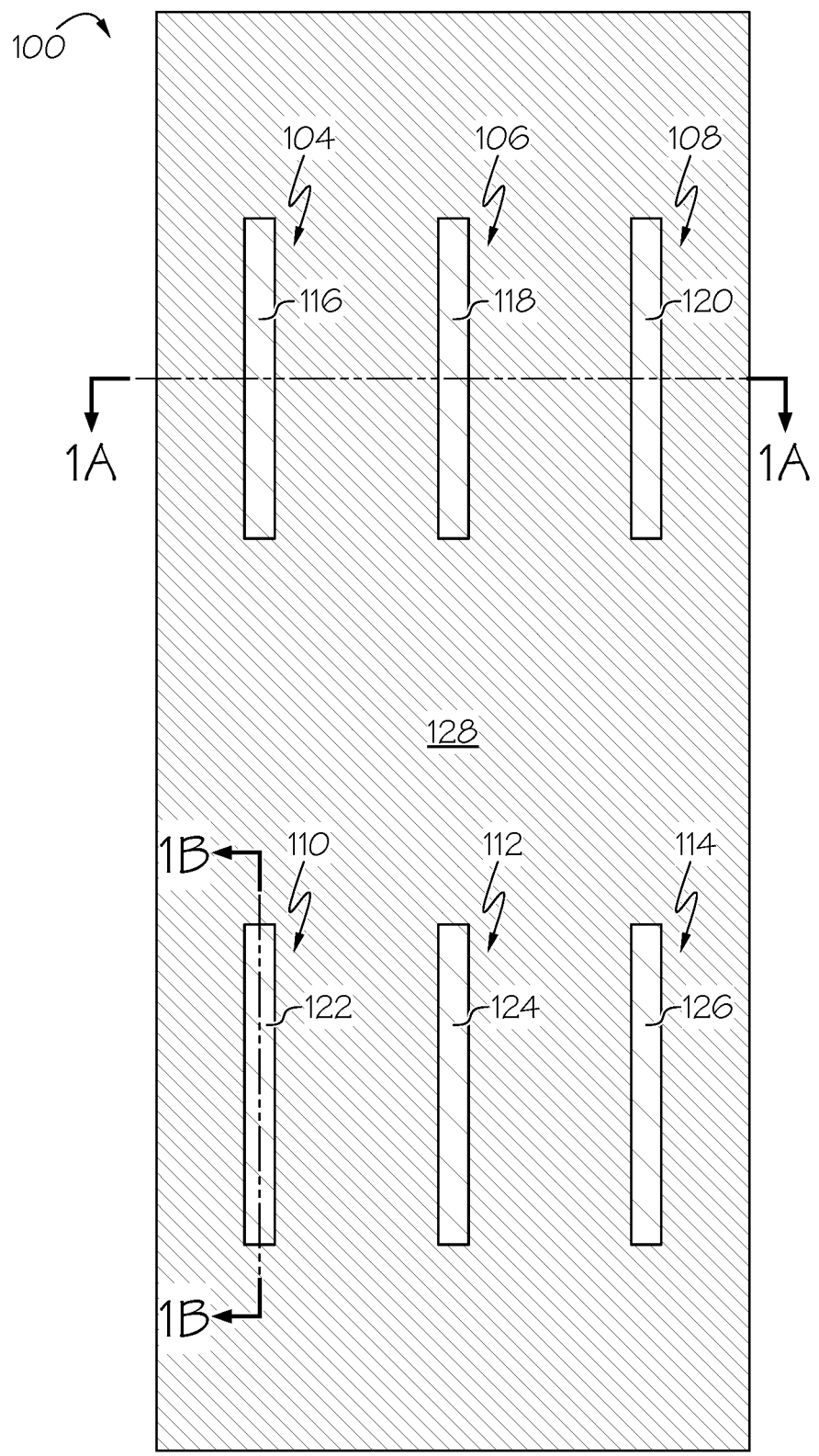
FIG. 1 is a plain view of a semiconductor device structure after a plurality of fins have been formed on a substrate according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Figure 12:
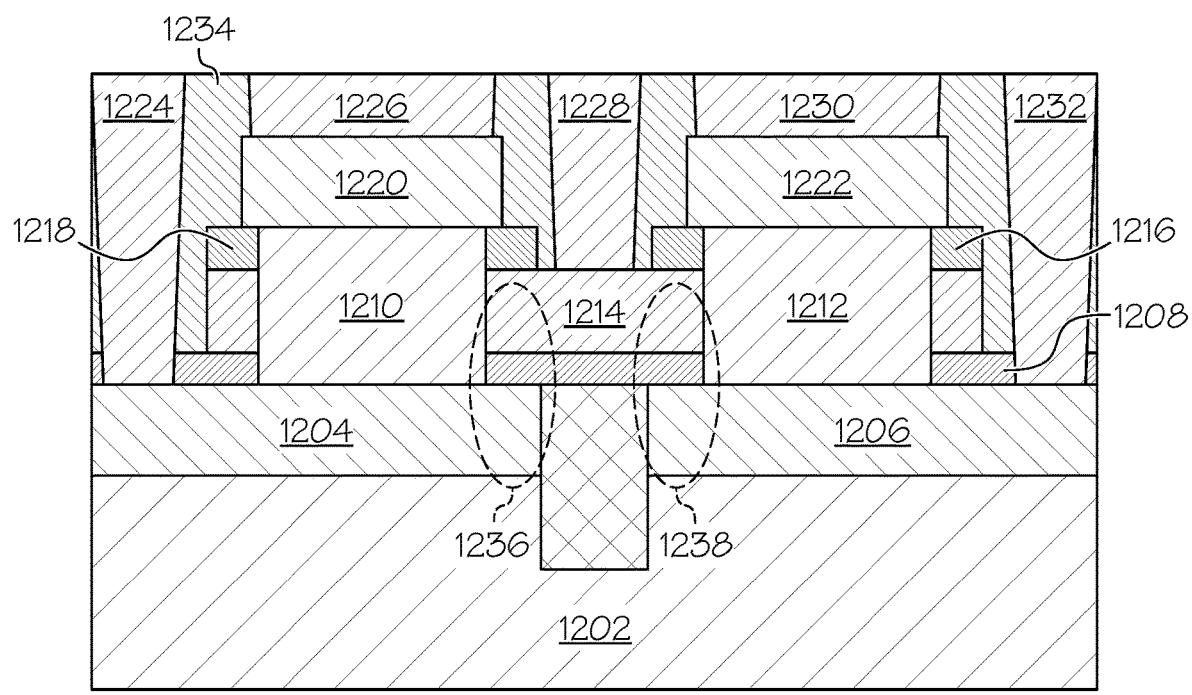
FIG. 12 shows a cross-sectional view of a conventional vertical field effect transistor structure.

Vertical FETs (VFETs) are being pursued as a viable CMOS architecture beyond the 7 nm node. In a typical VFET fabrication flow, the high-k metal gate is usually formed on and in contact with the with the bottom spacer. For example, FIG. 12 shows a cross-sectional view of a conventional VFET structure 120 having a substrate 1202; an epitaxial bottom source/drain layer 1204; 1206; a bottom spacer layer 1208; semiconductor fins 1210, 1212; a high-k metal gate 1214; top spacer layers 1216, 1218; top source/drain layers 1220, 1222; contacts 1224 to 1232; and a dielectric layer 1324. As shown in FIG. 12, the high-k metal gate 1214 is formed in contact with the semiconductor fins 1210, 1212 and is further formed on top of and in contact with the bottom spacer layer 1208, which is formed on and in contact with the epitaxial bottom source/drain layers 1204, 1206.

One problem with the configuration shown in FIG. 12 is that the portion of the active area highlighted by the dashed lines 1236, 1238 increases N-to-P isolation leakage and also introduces parasitic capacitance between the gate and the epitaxial bottom source/drain layer capacitance. In addition, during a typical VFET fabrication flow shallow trench isolation (STI) regions may be formed to isolate different VTFETs. In order to ensure the STI material is cleared from the source/drain regions, a sufficient oxide recess over etch is usually performed. The over etch process may result in an STI to bottom source/drain step that causes the metal gate to overlap/contact the bottom source/drain resulting in even higher parasitic capacitance.

As will be discussed in greater detail below, one or more embodiments address the above problems by performing self-aligned active area edge epi isolation. This process improves/reduces parasitic capacitance by recessing the portion of the bottom source/drain layer that is under the gate-to-active overlap region of the device. This recess forms a notched region near the gate contact edge that is subsequently filled with a dielectric material. The dielectric material separates/isolates the bottom source/drain layer from the metal gate and the bottom spacer layer thereby improving/reducing the parasitic capacitance in the gate-to-active region.

Figure 1A:
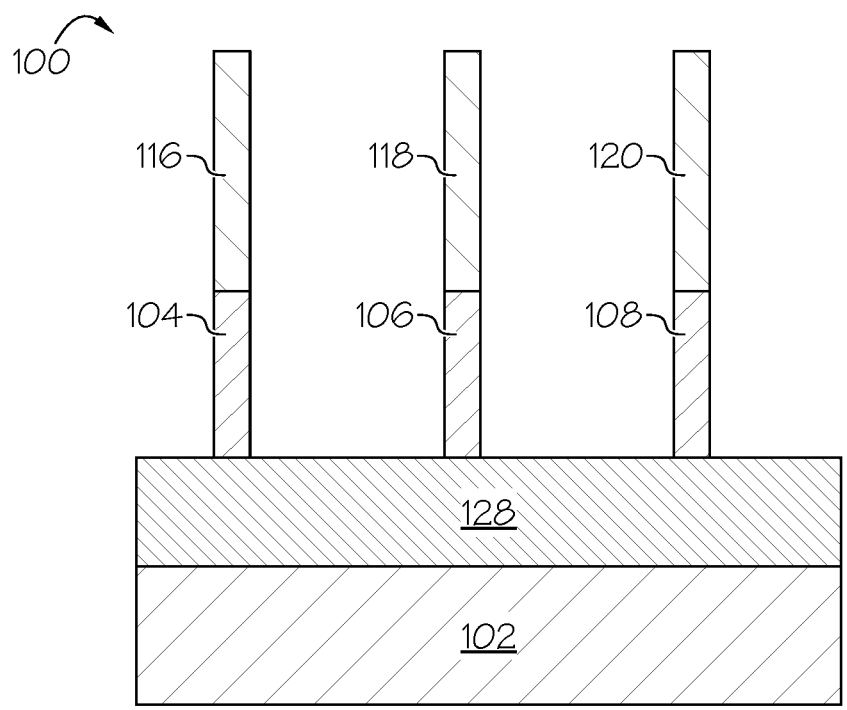
FIGS. 1A and 1B are a cross-sectional views of the semiconductor device structure after the plurality of fins have been formed on the substrate according to one embodiment of the present invention.
Figure 1B:
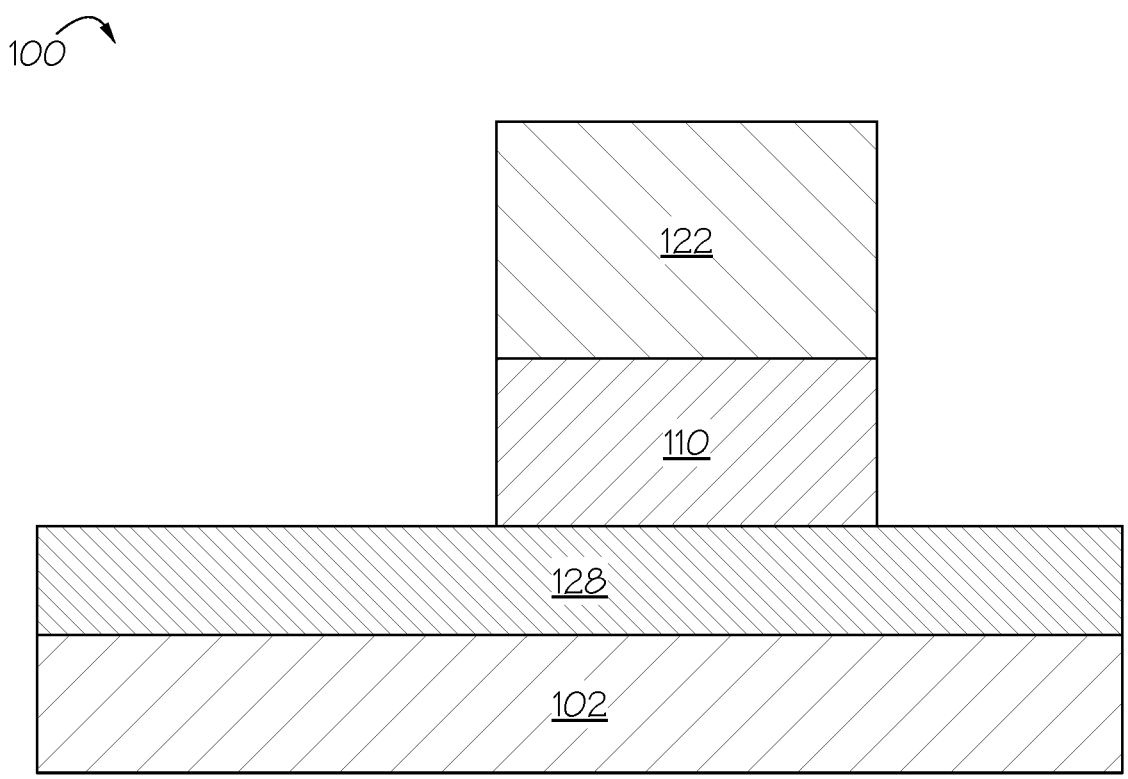

FIGS. 1-9B illustrate various processes for improving/reducing parasitic capacitance experienced by VFETs according to various embodiments of the present invention. In general, the figures comprise various cross-sectional views that are taken along a line that passes across one or more fins; while some cross-sectional views are taken along a line that pass through the long axis of a fin. FIGS. 1 to 1B show a semiconductor device structure 100 at a given point in the fabrication process. For example, FIGS. 1A and 1B show a substrate 102; one or more semiconductor fin structures 104 to 114; a hard mask 116 to 126 formed on and in contact with a top surface of each fin 104 to 114; and a first epitaxy layer 128 (also referred to herein as "bottom source/drain layer 128").

The structure 100 may comprise fins 104 to 114 for PFET devices, NFET devices, or a combination of both. In one embodiment, the substrate 102 comprises entirely of a semiconductor material. The substrate 102 may comprise a single crystalline semiconductor material or a polycrystalline material. In another embodiment, the substrate 102 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor an organic semiconductor material.

The substrate 102 may comprise undoped single crystalline silicon or single crystalline silicon doped with p-type dopant atoms or n-type dopant atoms. Examples of materials for the substrate 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 102 is formed on and in contact with a handle substrate or an insulating layer disposed in contact with a handle substrate. In this embodiment, the handle substrate includes similar materials to those discussed above.

Doping of the substrate 102 (or other semiconductor layer from which the fins 104 to 114 are formed) may be performed using, for example, ion implantation, or annealing if not using an epitaxial process. In a non-limiting illustrative example, the doping utilizes, for example, arsenic (As) or phosphorous (P) for n-type device, and boron (B) for a p-type device, at concentrations in the general range of, for example, $e20/cm^3$.

In other embodiments, the substrate 102 is a silicon-on-insulator (SOI) substrate. In this example, an optional dielectric layer (e.g., a BOX layer or oxide layer) overlies the substrate, and the fin structures 104, 106 are formed on and in contact with the dielectric layer. The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick. In an embodiment where the fins structures are formed on an SOI substrate, the fin structures and the substrate can be made of the same or different materials.

In an SOI embodiment, the semiconductor material/layer from which the fin structures 104, 106 are fabricated may be formed utilizing various methods such as a layer transfer process including a bonding step, or an implantation process such as SIMOX (Separation by IMplantation of OXygen). This semiconductor material/layer nay be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from $1\times10E18$ atoms/cm3 to $2\times10E21$ atoms/cm3. N-type transistors are produced by doping the semiconductor material/layer with elements from group V of the periodic table (e.g., phosphorus, antimony, or arsenic).

The semiconductor fin structures 104 to 114 may be formed by forming an etch-stop hard mask onto the substrate 102 (or semiconductor layer) through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fin structures 104 to 114 may be subsequently formed or etched out of the substrate 102 (or the semiconductor layer) through a process involving masking, using industry-standard lithographic techniques, and directionally etching (e.g., RIE) the etch-stop capping layer and underneath semiconductor layer (or substrate 102). After the RIE etching process, the photoresist mask used in the lithographic etching process may be removed, leaving the fin structures 104 to 114 and hard masks 116 to 126. In some embodiments, there may be different pitches between two or more of the fin structures to define different devices.

The substrate 102 may then be optionally recessed to form a bottom source/drain recess. The substrate 102 may be recessed using, for example, directional RIE. A lateral may also be performed to trim the fin bottom. The bottom source/drain layer 128 may then be formed. The bottom source/drain layer 128 may either be a source layer or a drain layer and formed in contact with the substrate layer 102 and a lower portion of the fin structures 104 to 114. A single bottom source/drain layer 128 (merged) may be formed for multiple fins 104 to 114 or a separate bottom source/drain layer 128 may be formed for each fin. Example materials for the bottom source/drain layer 128 include (but are not limited to) phosphorus doped silicon epitaxy for an nFET device and boron doped silicon germanium epitaxy for a pFET device.

In one embodiment, the bottom source/drain layer 128 may have a thickness of about 10 nm to about 100 nm. However, other thicknesses are applicable as well. The bottom source/drain layer 128 may be doped with dopant atoms. The dopant atoms may be an n-type dopant (i.e., an element from Group V of the Periodic Table of Elements) or a p-type dopant (i.e., an element from Group III of the Periodic Table of Elements). Examples of n-type dopants for a group IV semiconductor include phosphorus, arsenic and antimony. Examples of p-type dopants for a group IV semiconductor include boron, aluminum, and gallium. Examples of n-type dopants for a III-V semiconductor include selenium, tellurium, silicon, and germanium. Examples of p-type dopants for a III-V semiconductor include beryllium, zinc, cadmium, silicon, and germanium.

In some embodiments, the bottom source/drain layer 1282 may be formed by epitaxial growth of a semiconductor material. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

After the bottom source/drain layer 128 has been formed, an anneal may be performed to drive the dopant in the bottom source/drain into the fin structures 104 to 114. A thermal anneal process such as laser anneal, flash anneal, rapid thermal anneal (RTA), furnace anneal, or any suitable combination of those annealing techniques may be performed. This process forms a first doped fin region in a portion of the fin structures 104 to 114 laterally contacted by the bottom source/drain layer 128. It should be noted that the anneal may be performed at a subsequent point in the fabrication process. The dopant concentration of the bottom source/drain layer 128 may be from $1 \times 10^{20}$ atoms/cm3 to $1 \times 10^{22}$ atoms/cm3, although lesser and greater dopant concentrations may also be employed.

Figure 2A:
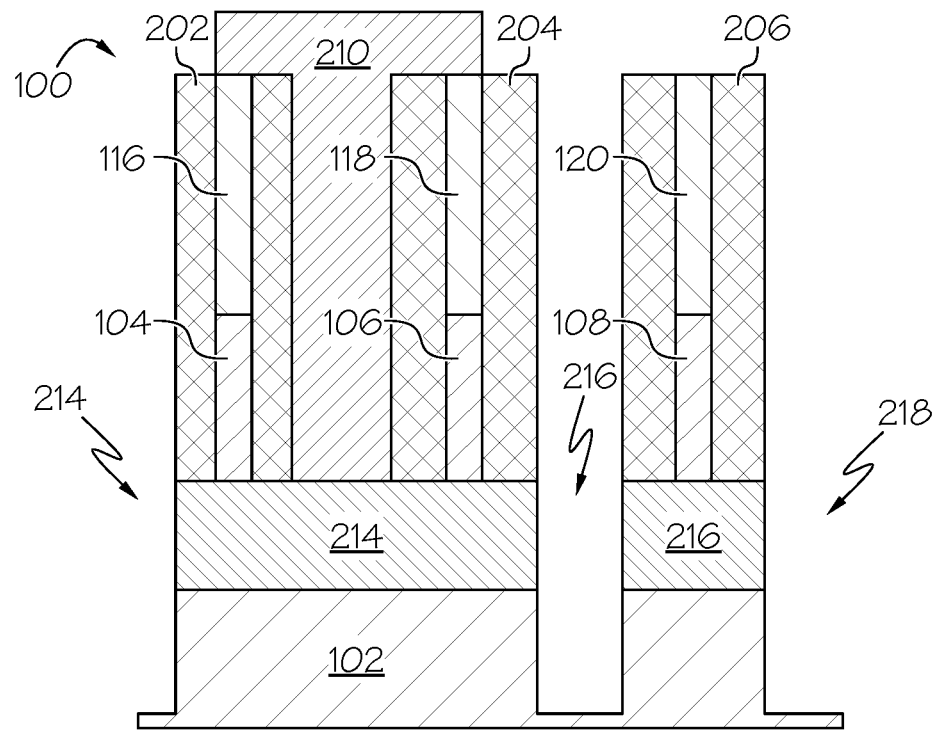
FIGS. 2A and 2B are a cross-sectional views of the semiconductor device structure after active area patterning has been performed according to one embodiment of the present invention.
Figure 2B:
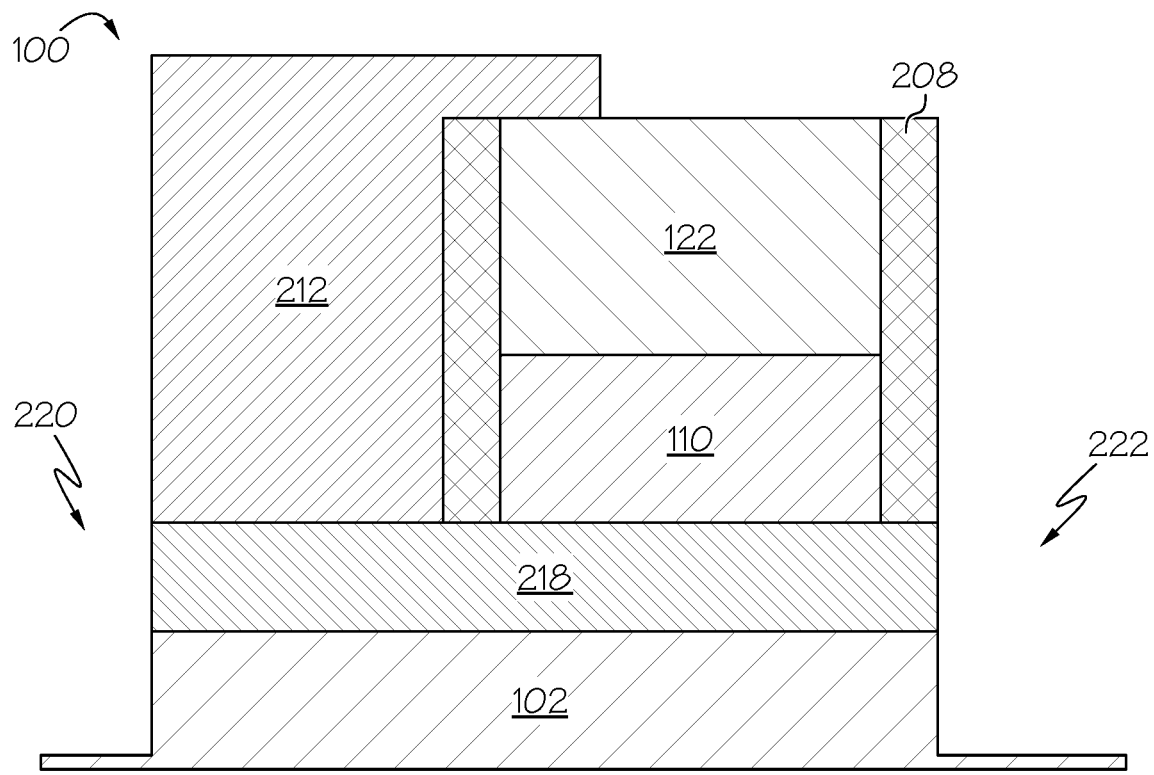

FIGS. 2A and 2B show that a spacer/liner 202 to 208 may be formed on the sidewalls of the fins 104 to 114. The liner 202 to 208 may be formed by one or more spacer formation techniques. For example, the liner 202 to 208 may be formed by conformally depositing a conformal layer of insulating material (e.g., silicon oxide, silicon oxycarbid, silicon oxycarbonitride, some other oxide, and the like) followed by an anisotropic etch (e.g., reactive ion etch (RIE)) of that material to form the liner 202 to 208 only on the sidewalls of the fin structures 104 to 114.

FIGS. 2A and 2B further show that an organic planarization layer (OPL) 210, 212 may be formed over portions of the structure 100. The OPL 210, 212 may be formed over the structure 100 using known organic materials and techniques. For example, the OPL 210, 212 may comprise a resin material that is applied by spin coating and baked to enhance planarization. In some embodiments, the OPL 210, 212 may comprise a liquid monomer that is applied by spin coating and photochemically hardened. The OPL 210, 212 may be patterned using lithographic techniques. In some embodiments, the OPL 210, 212 may be patterned to form an active area etch mask over some portions of the structure but not on other portions of the structure 100. In one or more embodiments, the OPL 210, 212 may be patterned into shapes that are transferred to the substrate 102.

After the OPL 210, 212 has been patterned, a self-aligned active area patterning process may be performed. This patterning process forms isolation trenches 214 to 222 by etching the exposed portions of the bottom source/drain layer 128 and at least a portion of the underlying region of the substrate 102. The patterning process also may pattern the bottom source/drain layer 128 into a plurality of bottom source/drain layers 224 to 228 each in contact with at least one of the fin structures. The etching process may be selective to the OPL 210, 212; liner 202 to 208; and hard masks 116 to 126.

Figure 3A:
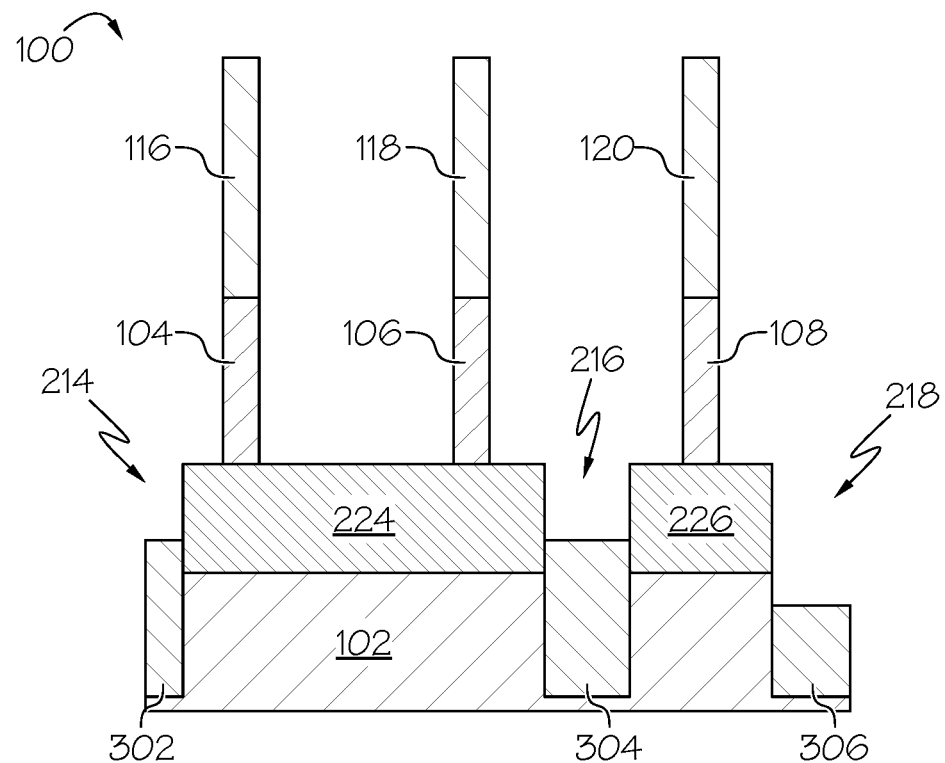
FIGS. 3A and 3B are a cross-sectional views of the semiconductor device structure after isolation trenches have been formed according to one embodiment of the present invention.
Figure 3B:
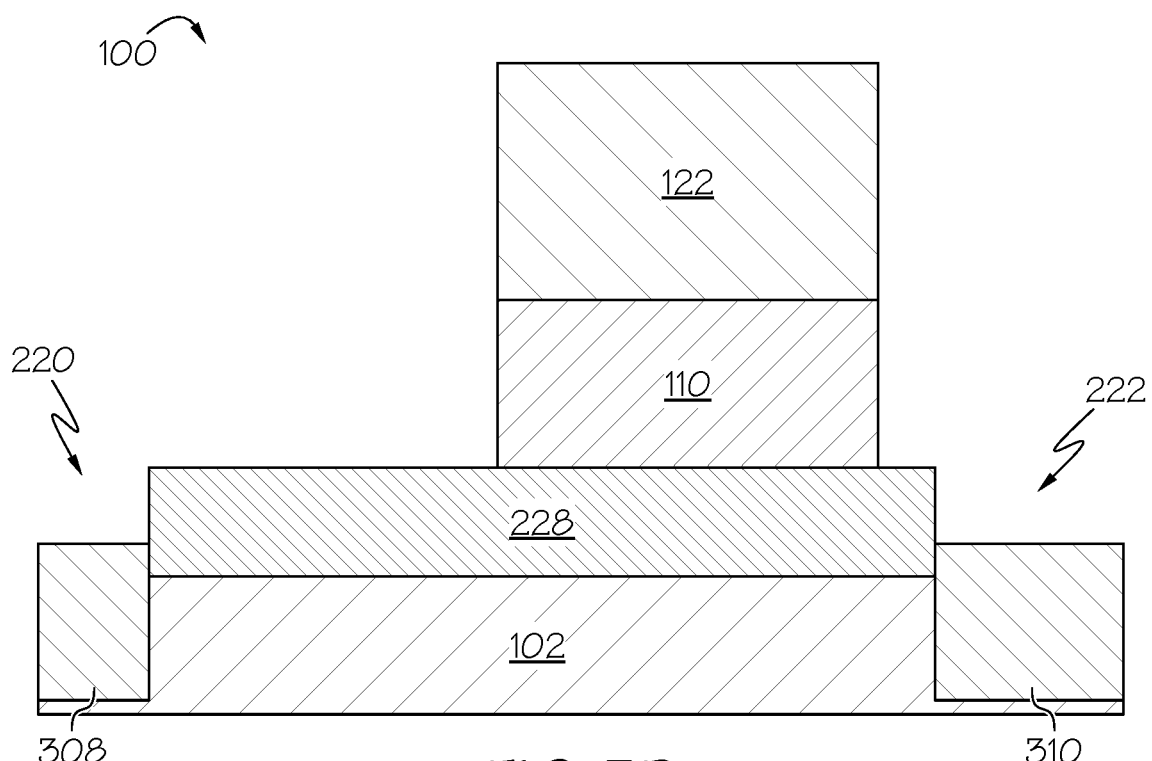

FIGS. 3A and 3B show that the OPL 210, 212 may then be removed by, for example, an ashing process. After the OPL 210, 212 has been removed an dielectric material (e.g. SiO2, or a thin liner of SiN followed by SiO2 fill) may be formed/deposited over the entire structure 100 and within the trenches 214 to 222 formed by the active area patterning process discussed above. The oxide material may be a flowable oxide another type of oxide. The oxide material may be overfilled and then polished back such that a top surface of the oxide material is planar with a top surface of the hard masks 116 to 126 and liner 202 to 208. A fin reveal process may then be performed to etch the oxide below a top surface of the bottom source/drain layer 224 to 228 and form isolation regions 302 to 310 comprising the oxide material. The fin reveal process may be performed using, for example, RIE, an isotropic process, a wet etch, and/or the like.

In some embodiments, there may be non-uniformity across the oxide material as shown in FIG. 3A. The non-uniformity may be caused etch loading effect since the density and layout of the devices may be different from region to region. The different densities and layouts may result in different amounts of etch loading resulting in the non-uniformity in the oxide reveal.

Figure 4A:
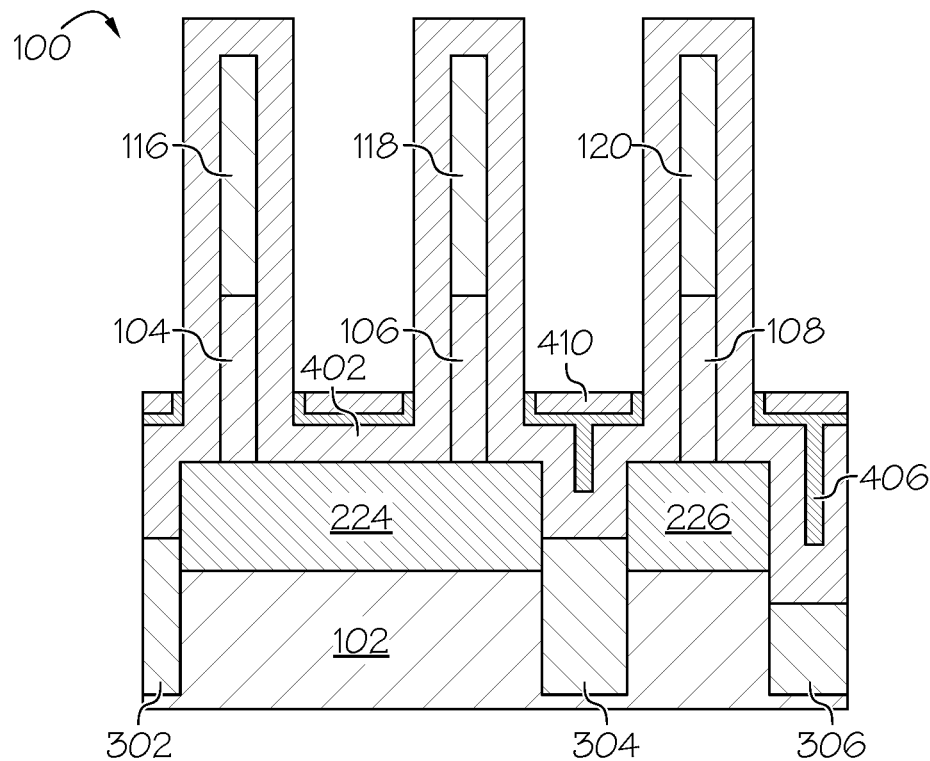
FIGS. 4A and 4B are a cross-sectional views of the semiconductor device structure after a spacer layer, liner, and additional oxide layer have been formed according to one embodiment of the present invention.
Figure 4B:
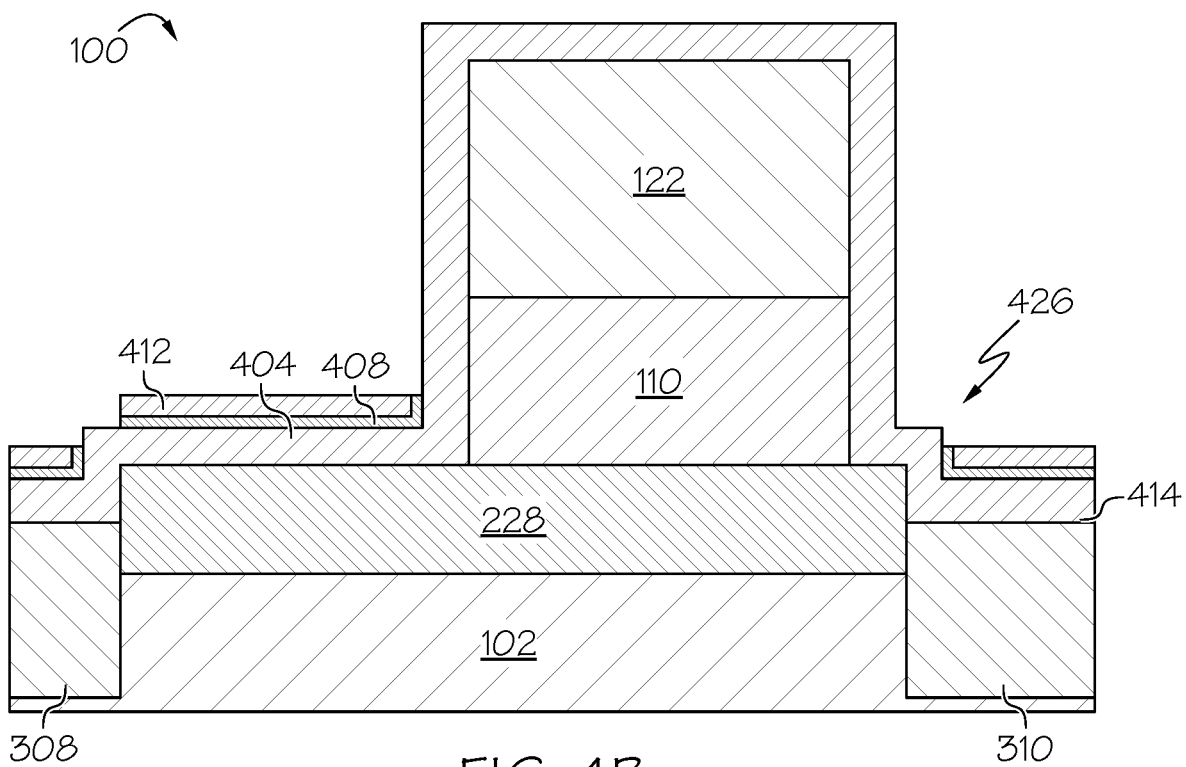

After the isolation regions 302 to 310 have been formed, a bottom spacer layer 402, 404 may be formed/deposited over the structure 100 as shown in FIGS. 4A and 4B. The formation of the bottom spacer layer 402, 404 may pinch-off the isolation regions 302 to 310 but does not pinch-off the at the edge of the fins 104 to 114. In one embodiment, the bottom spacer layer 402, 404 may include an insulating material (such as silicon oxide, silicon nitride, silicon oxynitride, or a combination of these) and may be formed using a conformal deposition process such as ALD, plasma enhanced ALD, CVD, plasma enhanced CVD, or combinations thereof. FIGS. 4A and 4B further show that a liner 406, 408 is formed over and in contact with the bottom spacer layer 402, 404. The liner 406, 408 may comprise an oxide (or other material) such as silicon oxide and may be formed/deposited using a conformal deposition process such as ALD, plasma enhanced ALD, CVD, plasma enhanced CVD, or combinations thereof.

An additional oxide layer 410, 412 may be formed/deposited on and in contact with the liner 406, 408. For example, a directional deposition process such as high density plasma (HDP) or GCIB may be used to form additional oxide material on the liner 406, 408. Since HDP is directional, more oxide material is deposited on the bottom horizontal regions of the structure than the vertical sidewalls of the structure. An isotropic oxide removal process such as BHF wet etch may then be used to remove any oxide residual at sidewall. Please note that this directional deposition may deposit materials with a faster rate at surfaces having certain sizes of flat regions, and may deposit materials with a slower deposition rate at vertical sidewall or small corners. Therefore, the oxide liner which has less deposition amount (e.g, over top of the fin, or over the short active extension) may be completely removed after BHF wet oxide etch.

Figure 5A:
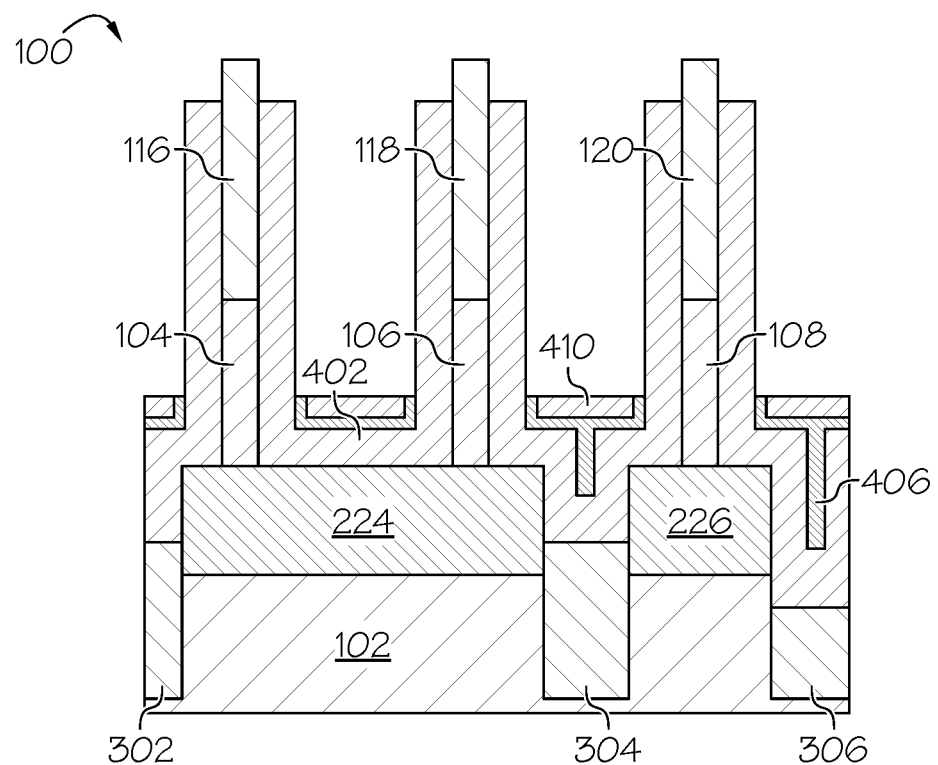
FIGS. 5A and 5B are a cross-sectional views of the semiconductor device structure after exposed horizontal portions of the spacer layer have been removed and an edge portion of a bottom source/drain layer has been exposed according to one embodiment of the present invention.
Figure 5B:
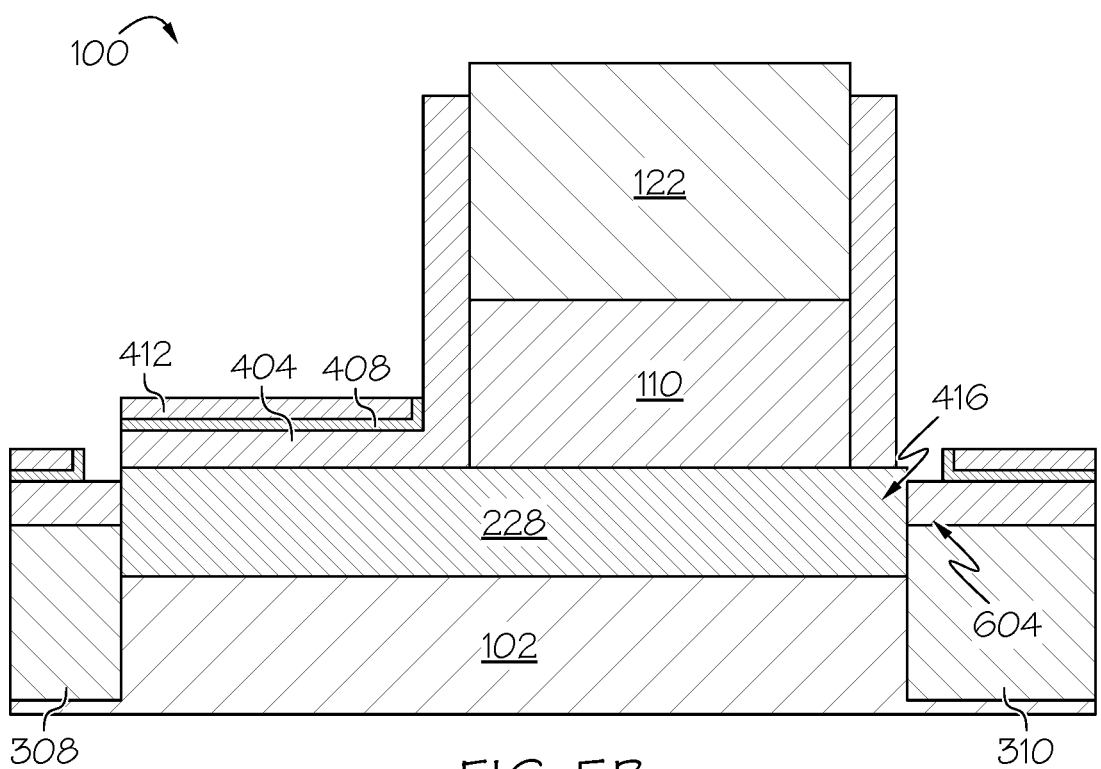

After the liner 406, 408 and the additional oxide layer/material 410, 412 have been etched back, a pull-down process is performed using an anisotropic etch to remove some of the exposed portions of the bottom spacer layer 402, 404 as shown in FIGS. 5A and 5B. In one embodiment, the anisotropic etch removes the horizontal top surfaces of the bottom spacer layer 402, 404 and the horizontal portion of the bottom spacer layer 404 formed at the edge 416 of the bottom source/drain layer 228. The anisotropic etch may further remove an additional portion of the bottom spacer layer underlying the removed horizontal portion 414. As a result of the anisotropic etch, a top surface and portions of the sidewalls of the hard masks 116 to 126 are exposed, and at least a portion of the bottom source/drain layer edge 416 is also exposed.

Figure 6:
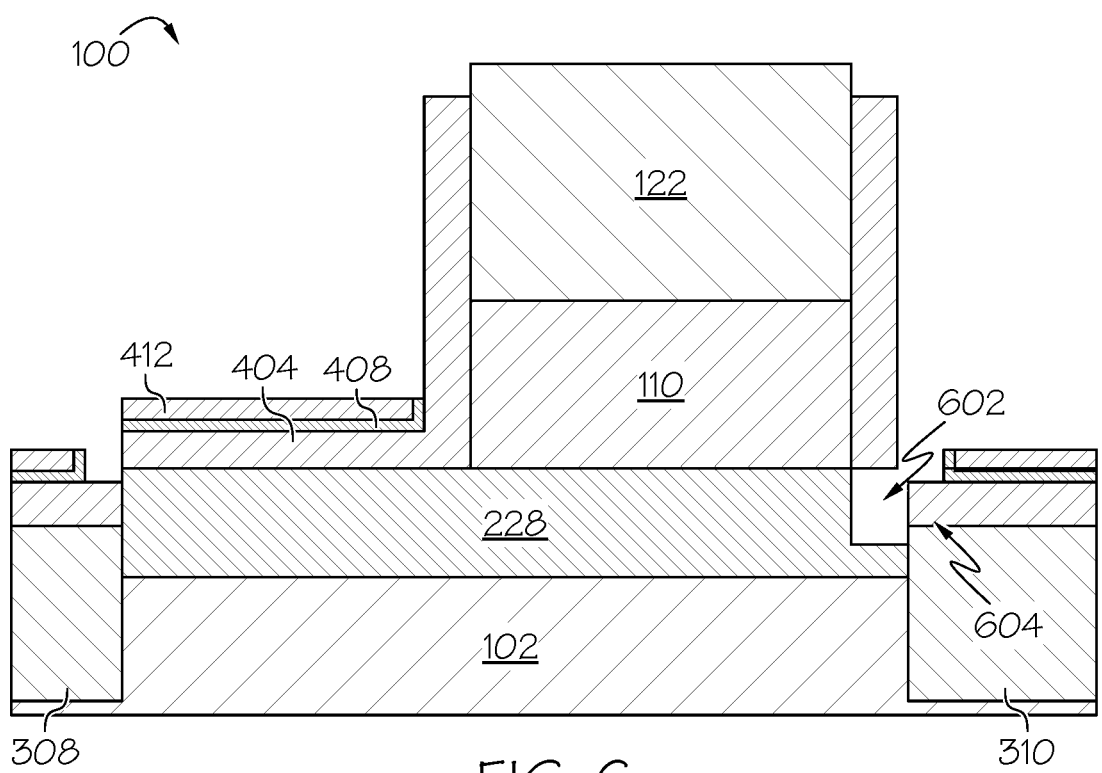
FIG. 6 is a cross-sectional views of the semiconductor device structure after the edge portion of the bottom source/drain layer has been recessed to form a notch according to one embodiment of the present invention.

FIG. 6 shows that an exposed epi undercut process is performed to etch a portion of the exposed bottom source/drain layer 228. A selective etching process that is selective to oxide and nitride may be used. In one embodiment, the selective etching process forms a notch/cavity 602 within an outer region of the bottom source/drain layer 228. For example, the etching process etches away a portion of the bottom source/drain layer 228 underlying an area where a portion of a gate stack is to be formed. This portion of the bottom source/drain layer 228 may be etched down to at least the bottom surface 604 of the bottom spacer layer 404.

Figure 7:
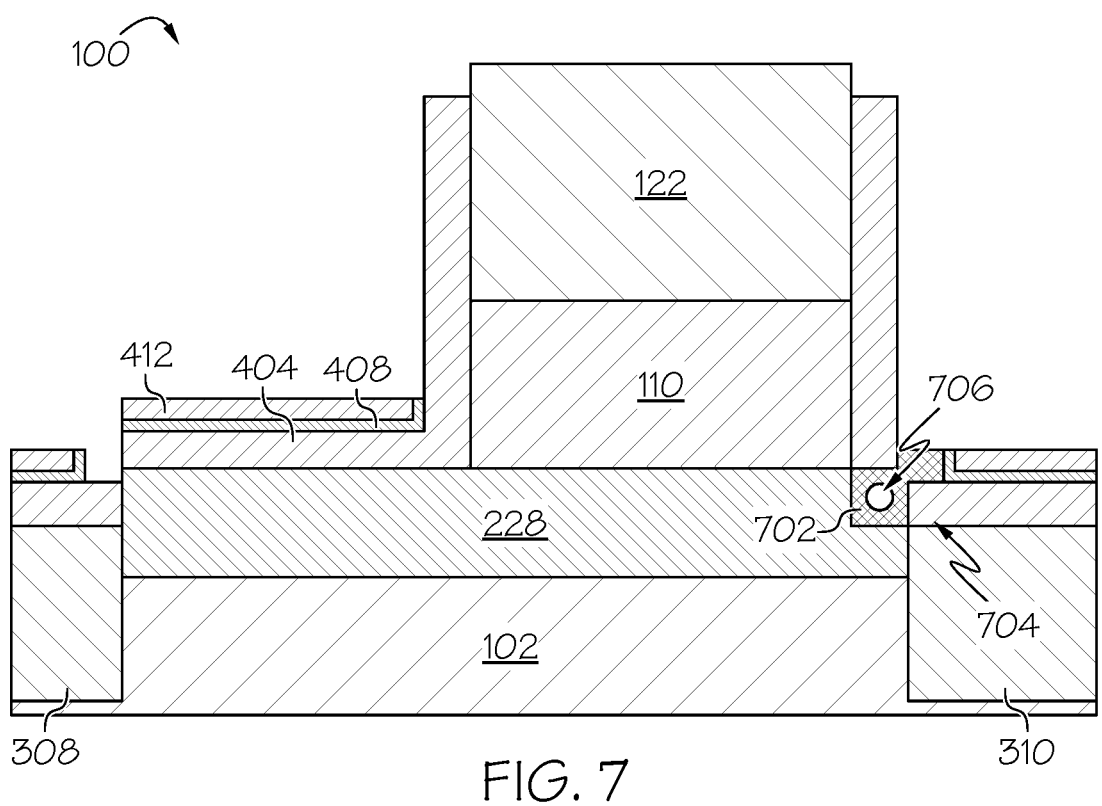
FIG. 7 is a cross-sectional views of the semiconductor device structure after the notch in the bottom source/drain layer has been filled with a dielectric material according to one embodiment of the present invention.

FIG. 7 shows that the notch/cavity 602 is filled with a dielectric material 702. For example, a dielectric material such as SiO2, Si3N4, SiOxNy, SiC, SiCO, SiCOH, and SiCH compounds, and/or the like may be deposited over the structure 100 and within the notch/cavity 602. An isotropic etch back process may be performed to etch down the dielectric material 702 such that a top surface off the material is planar with a top surface of the liner 408 and additional oxide layer 412. In one embodiment, the dielectric material 702 contacts multiple portions of the bottom source/drain layer 228; comprises a bottom surface that is below the top surface of the bottom source/drain layer 228; and is further on and in contact with a top surface of a lower horizontal portion 704 of the bottom spacer layer 404. The portion of the dielectric material 702 formed in the notched area/cavity 602 may or may not comprise a void or air gap 706 depending in the size and geometry of the notched area/cavity 602. The dielectric material 702 isolates at least the edge region 416 of the bottom source drain 224 to 228 from the subsequently form gate structure 902 to 906 (FIGS. 9A and 9B) and bottom spacer layer 402, 404 thereby reducing any parasitic resulting from the proximity of the one or more gate structures 902 to 906 to the bottom source/drain layer 224 to 228.

Figure 8A:
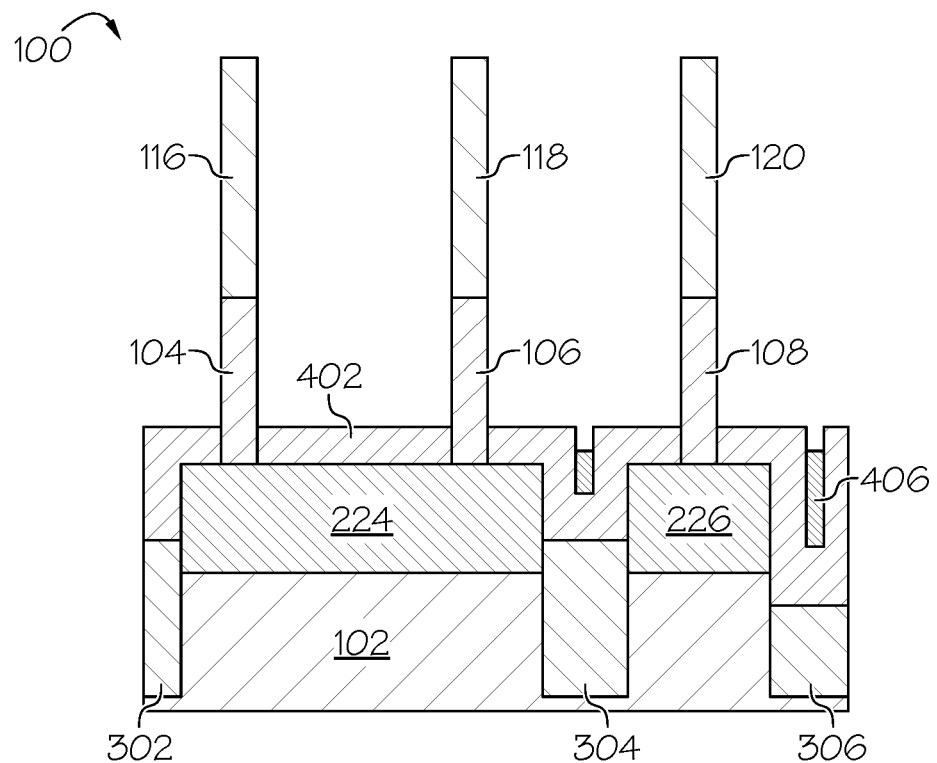
FIGS. 8A and 8B are a cross-sectional views of the semiconductor device structure after the liner, the additional oxide layer, and vertical portions of the spacer layer have been removed according to one embodiment of the present invention.
Figure 8B:
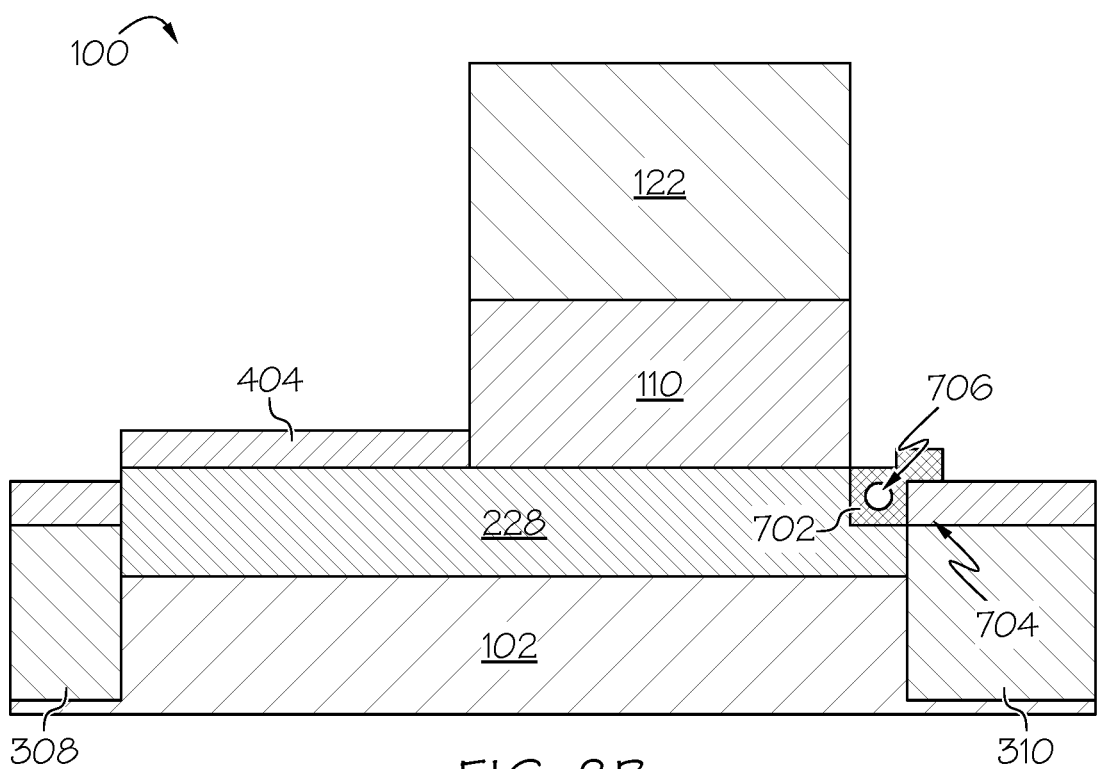

Exposed vertical portions of the bottom spacer layer 402, 404 are then removed, as shown in FIGS. 8A and 8B. An anisotropic etch may be used to remove the vertical portions of the bottom spacer layer 402, 404. This process exposes at least a portion of the fin structure 104 to 114 sidewalls and the sidewalls of the hard masks 116 to 126, and leaves a portion of the bottom spacer layer 402, 404 on and in contact with the oxide material in the isolation trenches 302 to 310; the bottom source/drain layer 224 to 228; a portion of the sidewalls of the fin structures 104 to 114; and a portion of the dielectric material 702. The liner 406, 408 and the additional oxide layer 502, 504 may be removed using an etch back process. However, some of the liner material 406 may remain in the pinch-off region.

Figure 9A:
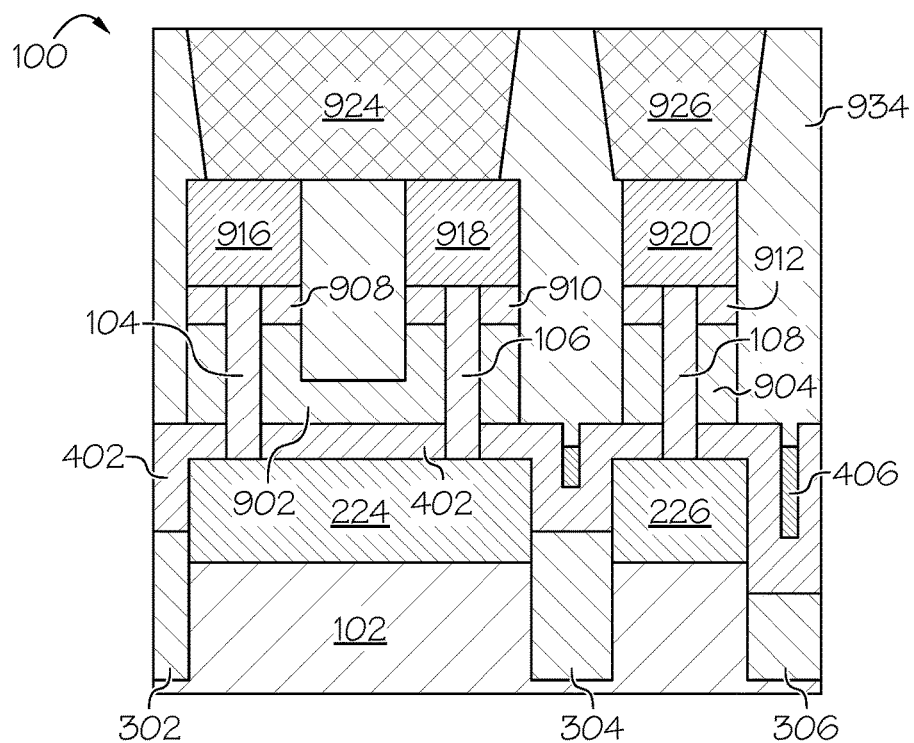
FIGS. 9A and 9B are a cross-sectional views of the semiconductor device structure after remaining layers of the semiconductor device structure and contacts have been formed according to one embodiment of the present invention.
Figure 9B:
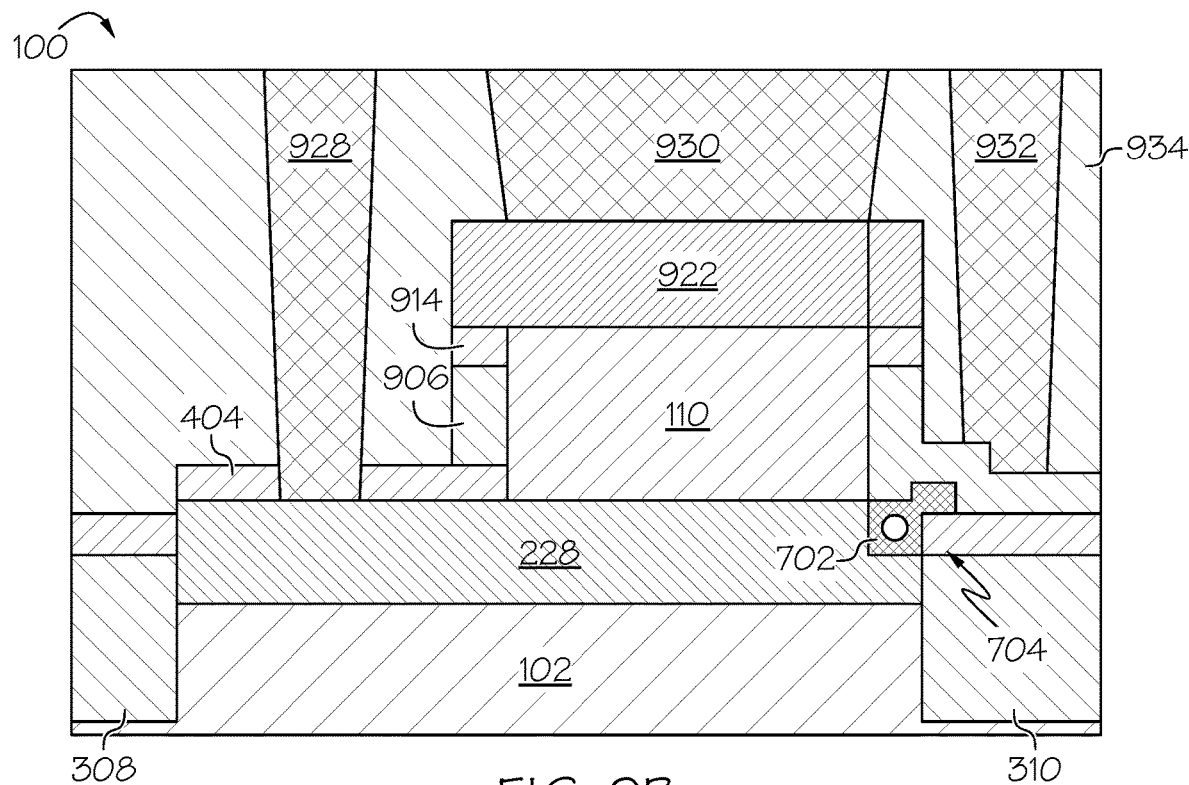

Processing may continue to complete the VTFET device(s), as shown in FIGS. 9A and 9B. For example, one or more gate structures 902 to 906; top spacer layers 908 to 914; top source/drain layers 916 to 922; and contacts 924 to 932 may be formed. The one or more gate structures 902 to 906 may be formed by first forming an insulating layer formed in contact with and surrounding a portion of the fin sidewalls; a top surface of portions of the bottom spacer layer 402, 404; and exposed portions of the dielectric material 702. The insulating layer may be formed by depositing a thin conformal layer over the structure by, for example, CVD, PECVD, or ALD and then performing an etch to remove the insulating material from portions of the structure.

In one embodiment, the insulating layer may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer may further include dopants such as lanthanum or aluminum.

After formation of the insulating layer, an annealing process may be performed to form bottom source/drain junctions within a portion of the fins 104 to 114. In one or more embodiments, an annealing process may be conducted after the formation of the bottom source/drain layer 224 to 228 in order to push the bottom junctions further into the fins 104 to 114. A thermal anneal process such as laser anneal, flash anneal, rapid thermal anneal (RTA), furnace anneal, or any suitable combination of those annealing techniques may be performed.

One or more or more conductive gate layers may then be formed in contact with and surrounding the vertical sidewalls of the insulating layer, and may also be in contact with a top surface of the insulating layer that are in contact with the bottom spacer layer 224 to 228 and dielectric material 702. In one embodiment, the conductive gate layers may be formed by depositing one or more conductive materials over the structure. An isotropic etch may be performed to recess the gate structure, including the insulating layer and conductive gate layers. The insulating layer and conductive gate layers form a gate structure. A single gate structure may be formed for multiple fins, or separate gate structures may be formed for each of the multiple fins. If the structure comprises both PFET and NFET devices, PFET conductive materials may first be deposited. The PFET device may then masked off and one or more NFET conductive materials are deposited over the entire structure. The masking layer is then removed from the PFET device. In other embodiments, the NFET device may be masked off during deposition of the PFET gate layers.

Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack.

The top spacer layer(s) 908 to 914 may be formed on and in contact with the top surface of the conductive gate layers and insulating layers of the gate structure(s) 902 of the gate structure(s) 902 to 906, and may further be formed in contact with a portion of the fin structure sidewalls. The top surface of the spacer layer(s) 908 to 914 may be co-planar with the top surfaces of the fin structures 104 to 114. In one embodiment, the spacer layers 908 to 914 may comprise the same or different material as the bottom spacer layers 402, 404. For example, the top spacer 908 to 914 may comprise an insulating material (such as silicon oxide, silicon nitride, silicon oxynitride, or a combination of these) and may be formed using any conventional deposition process such as, for example, chemical vapor deposition (CVD) and subsequent etching techniques. The deposited spacer material may be subsequently etched to form the final spacer structure.

A dielectric layer (shown as part of layer 934) may then be formed on the structure 100. The dielectric layer, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Planarization, for example, CMP can be performed to remove excess material from the dielectric layer. The planarization can be performed down to the hard masks 116 to 126.

The hard masks 116 to 126 may be selectively removed by, for example, RIE which stops on the fin structures 104 to 114. The top source/drains layers 916 to 922 may then be formed in contact with at least the exposed portions of the fin structures 104 to 114, which may have source/drain junctions formed therein. The top source/drains 916 to 922 may be formed using an epitaxy process. For example, selective epitaxy may be used to grow material from the exposed portions of the fin structures 104 to 114 to form the top source/drain layers 916 to 922. The top source/drain layers 916 to 922 may either be a source layer or a drain layer and may comprise in-situ doping (boron, in one embodiment for PFET and phosphorus, in one embodiment, for NFET).

It should be noted that, according to one embodiment, the top source/drain layers 916 to 922 may not contain any doping. Doping may be performed using any standard approach such as ion implantation. In particular, due to the slower growth rates on (111) orientated surface during the epitaxial growth so that faceted top source/drain layers 916 to 922 are obtained. In some embodiments, the top/source drain layers 916 to 922 may comprise a diamond shape. The epitaxial growth of diamond shaped epitaxy is self-limiting to the outer <111> plane resulting in diamond outer periphery. It should be noted that, non-faceted epitaxy and/or multiple epitaxy steps can be used to form the top source/drain layers 916 to 922 without limiting the scope of the present invention. It should also be noted that, in some embodiments, the top/source drain layers 916 to 922 may be merged.

In one or more embodiments, an annealing process may be conducted after the formation of the top source/drain layer 916 to 922 in order to push any formed top junctions further into the fin structures 104 to 114. A thermal anneal process such as laser anneal, flash anneal, rapid thermal anneal (RTA), furnace anneal, or any suitable combination of those annealing techniques can be performed. In some embodiments.

An additional dielectric 934 may then be formed over the entire structure. The dielectric layer 934, in one embodiment, may include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The dielectric layer 934 may be patterned and etched to form one or more contact openings/trenches (not shown) to expose portions of the top source/drain layers 916 to 922; portions of the bottom source/drain layers 224 to 228; and portions of the gate structures 902 to 906. One or more contact metal/metallic contacts 924 to 932 may then be formed within the contact opening(s). The contact metal/metallic contacts 924 to 932 may fill the contact opening(s) and contact portions of the top source/drain layers 916 to 922 (or any liner and/or the silicide formed thereon); portions of of the bottom source/drain layers 224 to 228 (or any liner and/or the silicide formed thereon); and portions of the gate structures 902 to 906. The contact metal layer(s), in one embodiment, may comprise tungsten (W), titanium (Ti), tantalum (Ta), TiN, hafnium (Hf), zirconium (Zr), niobium (Nb), or alloys comprising carbon. However, other materials are applicable as well.

Figure 10:
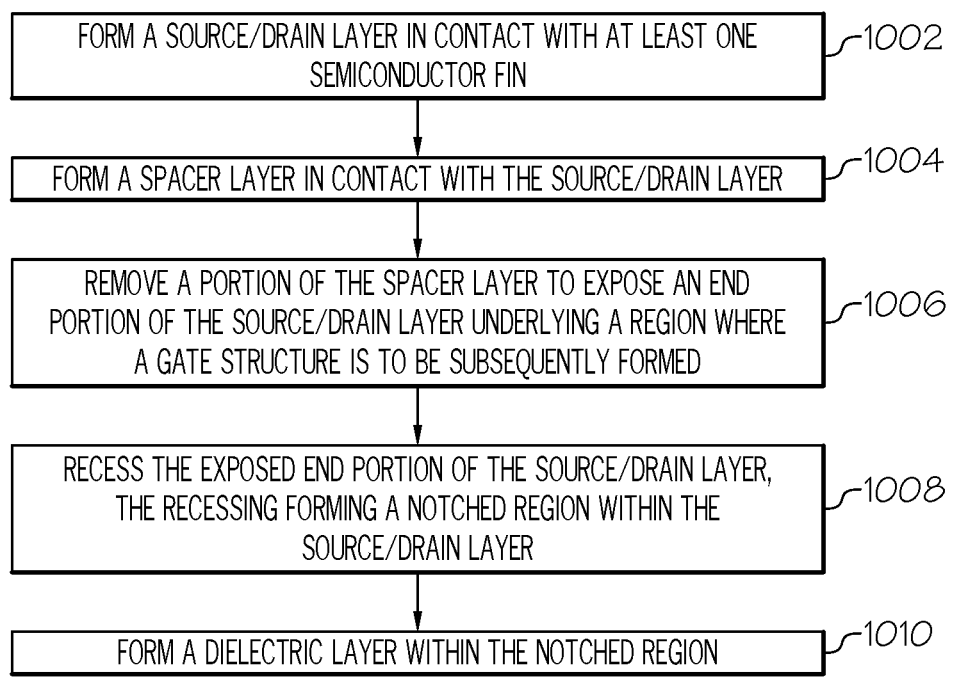
FIG. 10 is an operational flow diagram illustrating one example of a process for forming a vertical field effect transistor structure according to one embodiment of the present invention.

FIG. 10 is an operational flow diagram illustrating one example of a process for forming a vertical field effect transistor structure. It should be noted that each of the steps shown in FIG. 10 has been discussed in greater detail above with respect to FIGS. 1 to 9B. A source/drain layer is formed in contact with at least one semiconductor fin at step 1002. A spacer layer is formed in contact with the source/drain layer at step 1004. A portion of the spacer layer is removed, at step 1006, to expose an end portion of the source/drain layer underlying a region where a gate structure is to be subsequently formed. The exposed end portion of the source/drain layer is recessed at step 1008. The recessing forms a notched region within the source/drain layer. A dielectric layer is formed within the notched region at step 1010.

Figure 11:
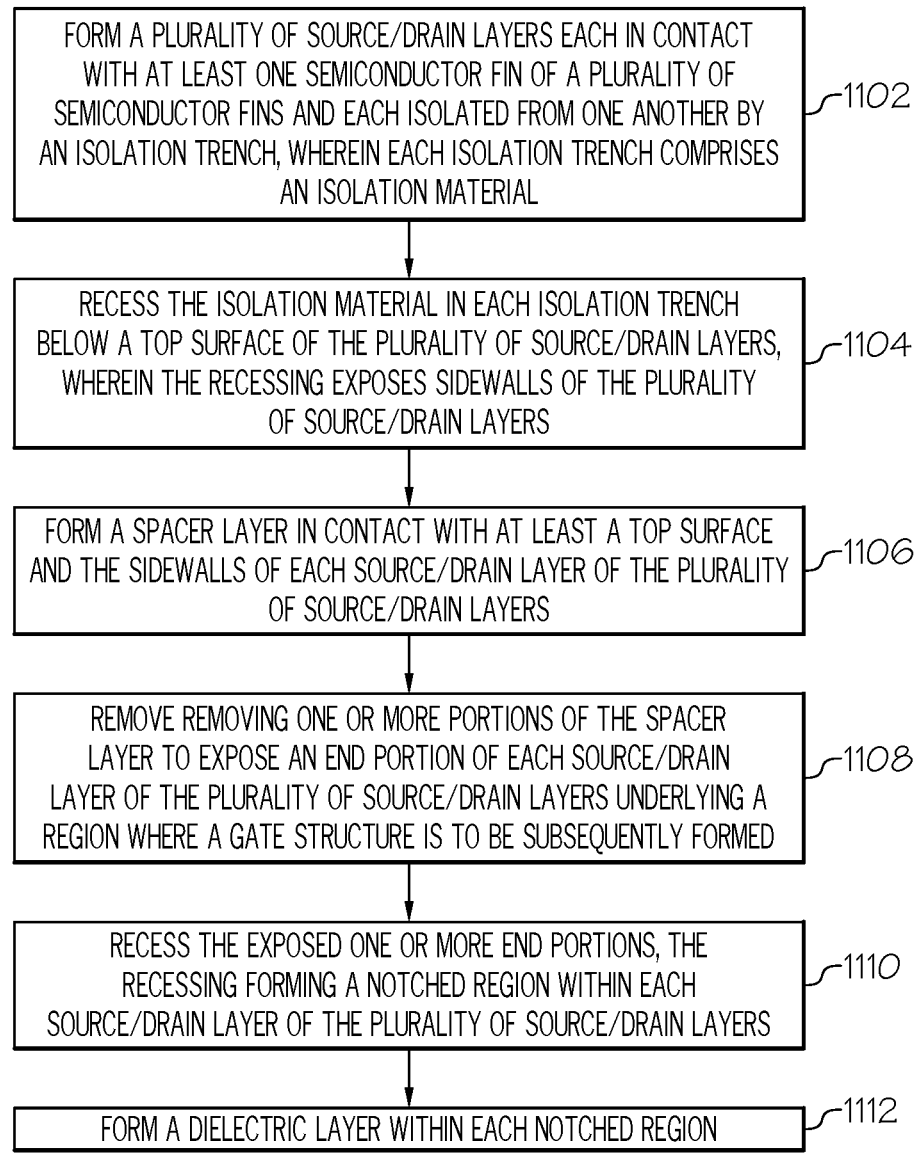
FIG. 11 is an operational flow diagram illustrating one example of a process for forming semiconductor structure comprising a plurality of vertical field effect transistors according to one embodiment of the present invention.

FIG. 11 is an operational flow diagram illustrating one example of a process for forming semiconductor structure comprising a plurality of vertical field effect transistors. It should be noted that each of the steps shown in FIG. 11 has been discussed in greater detail above with respect to FIGS. 1 to 9B. A plurality of source/drain layers each is formed at step 1102. Each of the source/drain layers in the plurality of source/drain layers is in contact with at least one semiconductor fin of a plurality of semiconductor fins and each isolated from one another by an isolation trench. Each isolation trench comprises an isolation material.

The isolation material in each isolation trench is recessed below a top surface of the plurality of source/drain layers at step 1104. The recessing exposes sidewalls of the plurality of source/drain layers. A spacer layer is formed in contact with at least a top surface and the sidewalls of each source/drain layer of the plurality of source/drain layers at step 1106. One or more portions of the spacer layer are removed, at step 1108, to expose an end portion of each source/drain layer of the plurality of source/drain layers underlying a region where a gate structure is to be subsequently formed. The exposed one or more end portions are recessed at step 1110. The recessing forms a notched region within each source/drain layer of the plurality of source/drain layers. A dielectric layer is formed within each notched region at step 1112.

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for forming a vertical field effect transistor structure, the method comprising at least:
   forming a source/drain layer in contact with at least one semiconductor fin;
   forming a spacer layer in contact with the source/drain layer;
   removing a portion of the spacer layer to expose an end portion of the source/drain layer underlying a region where a gate structure is to be subsequently formed;
   recessing the exposed end portion of the source/drain layer, the recessing forming a notched region within the source/drain layer under a bottom surface of a vertical portion of the spacer layer and extending below a top surface of an isolation region; and
   forming a dielectric layer within the notched region.

2. The method of claim 1, wherein forming the dielectric layer comprises:
   forming the dielectric layer in contact with the source/drain layer and a portion of the spacer layer.

3. The method of claim 2, wherein forming the dielectric layer on the portion of the spacer layer comprises:
   forming the dielectric layer in contact with a sidewall and a top surface of the portion of the spacer layer.

4. The method of claim 1, wherein the dielectric layer isolates the end portion of the source/drain layer from the gate structure and a portion of the spacer layer.

5. The method of claim 1, wherein prior to removing the portion of the spacer layer, the method comprises:
   forming one or more oxide layers over horizontal portions of the spacer layer except for the portion of the spacer layer, wherein the one or more oxide layers protect underlying portions of the spacer layer during removal of the portion of the spacer layer for exposing the end portion of the source/drain layer.

6. The method of claim 1, wherein after the dielectric layer has been formed within the notched region, the method further comprises:
   removing portions of the spacer layer from vertical surfaces of at least the at least one semiconductor fin.

7. The method of claim 6, further comprising:
forming a metal gate structure in contact with sidewalls of the at least one semiconductor fin, the dielectric layer, and a portion of the spacer layer;
forming an additional spacer layer above the spacer layer and in contact with a top surface of the metal gate structure and sidewalls of the at least one semiconductor fin; and
forming an additional source/drain layer above the source/drain layer and in contact with a top surface of the additional spacer layer and a top surface of the at least one semiconductor fin.

8. The method of claim 1, further comprising:
forming the isolation region in contact with the source/drain layer prior to forming the spacer layer.

9. The method of claim 8, wherein forming the spacer layer comprises:
forming a portion of the spacer layer on and in contact with a top surface of the isolation region.

10. The method of claim 1, further comprising:
forming a metal gate structure in contact with the dielectric layer.

11. A method for forming a vertical field effect transistor structure, the method comprising at least:
forming a source/drain layer in contact with at least one semiconductor fin;
forming a bottom spacer layer in contact with the source/drain layer;
recessing an exposed end portion of the source/drain layer, the recessing forming a notched region within the source/drain layer;
forming a dielectric layer within the notched region;
forming a metal gate structure in contact with at least the dielectric layer and the at least one semiconductor fin; and
forming a top spacer layer in contact with the metal gate structure and the at least one semiconductor fin.

12. The method of claim 11, wherein forming the dielectric layer comprises:
forming the dielectric layer in contact with the source/drain layer and a portion of the bottom spacer layer.

13. The method of claim 12 wherein forming the dielectric layer on the portion of the bottom spacer layer comprises:
forming the dielectric layer in contact with a sidewall and a top surface of the portion of the bottom spacer layer.

14. The method of claim 11, wherein the dielectric layer isolates the one or more portions of the source/drain layer in contact with the dielectric layer from the metal gate structure and a portion of the bottom spacer layer.

15. The method of claim 11, further comprising:
forming at least one oxide layer over one or more horizontal portions of the bottom spacer layer, wherein the at least one oxide layer protects underlying portions of the bottom spacer layer during removal of a portion of the bottom spacer layer for exposing the end portion of the source/drain layer.

16. The method of claim 11, wherein after the dielectric layer has been formed within the notched region, the method further comprises:
removing portions of the bottom spacer layer from at least vertical surfaces of the at least one semiconductor fin.

17. The method of claim 16, wherein forming the metal gate structure further comprises:
forming the metal gate structure in contact with sidewalls of the at least one semiconductor fin and a portion of the bottom spacer layer.

18. The method of claim 11, further comprising:
forming an isolation region in contact with the source/drain layer prior to forming the bottom spacer layer.

19. The method of claim 18, wherein forming the bottom spacer layer comprises:
forming a portion of the bottom spacer layer on and in contact with a top surface of the isolation region.

20. The method of claim 11, further comprising:
forming an additional source/drain layer above the source/drain layer and in contact with a top surface of the top spacer layer and a top surface of the at least one semiconductor fin.

* * * * *